(12) United States Patent
Kurtz

(10) Patent No.: US 7,683,629 B2
(45) Date of Patent: Mar. 23, 2010

(54) CIRCUIT TESTER DEVICE

(75) Inventor: Scotty R. Kurtz, Clarinda, IA (US)

(73) Assignee: Lisle Corporation, Clarinda, IA (US)

( * ) Notice: Subject to any disclaimer, the term of this patent is extended or adjusted under 35 U.S.C. 154(b) by 223 days.

(21) Appl. No.: 11/763,482

(22) Filed: Jun. 15, 2007

(65) Prior Publication Data

US 2008/0309347 A1    Dec. 18, 2008

(51) Int. Cl.
  *G01R 31/02*  (2006.01)
  *G01R 31/08*  (2006.01)
(52) U.S. Cl. ............... 324/543; 324/72.5; 324/522
(58) Field of Classification Search ............ 324/72.5, 324/543, 522
  See application file for complete search history.

(56) References Cited

U.S. PATENT DOCUMENTS

| | | | |
|---|---|---|---|
| 1,738,287 A | 12/1929 | Dirksen | |
| 3,015,161 A * | 1/1962 | Semler et al. ............ | 30/363 |
| 3,337,801 A | 8/1967 | Rinier et al. | |
| 3,404,340 A | 10/1968 | Labrie | |
| 3,527,075 A * | 9/1970 | Abromavage ............ | 72/31.1 |
| 3,626,358 A | 12/1971 | Klassen | |
| 4,225,990 A | 10/1980 | Theiler, Sr. | |
| 4,361,800 A | 11/1982 | Fodali et al. | |
| 4,709,206 A | 11/1987 | Edwards et al. | |
| 4,736,480 A | 4/1988 | Bohl et al. | |
| 5,424,630 A | 6/1995 | Vazquez | |
| 5,497,522 A | 3/1996 | Chen | |
| 5,711,182 A | 1/1998 | Yang | |
| 5,893,185 A | 4/1999 | Okrepkie et al. | |
| 6,009,582 A | 1/2000 | Harrison et al. | |
| 6,552,522 B1 | 4/2003 | Zook | |

OTHER PUBLICATIONS

Invention Disclosure Agreement, No. 03-459 dated Nov. 12, 2003 by Tim Crawley for a clamp-on voltage tester.
Invention Disclosure Agreement, No. 00-476 dated Nov. 29, 2000 by John Hodgon for test light pliers.
Invention Disclosure Agreement, dated May 29, 1990 by Thomas R. Henry for an electrical test tool.
Invention Disclosure Agreement, No. 99-502 dated Oct. 28, 1999 by Thomas G. Hagle for a tool for testing electrical wiring.
Invention Disclosure Agreement dated Sep. 29, 1992 by Timothy D. Jenkins for an electrical circuit testing tool.
Invention Disclosure Agreement dated May 24, 1989 by A. G. Kennedy for electrical testing pliers.
Invention Disclosure Agreement dated Mar. 22, 1984 by Edward A. Levicke for an automotive test light.
Invention Disclosure Agreement dated Feb. 20, 1989 by Jorge Morales for a current tester.
Invention Disclosure Agreement dated Sep. 28, 1992 by Raymond E. Padgett for a circuit tester and test lead.

(Continued)

*Primary Examiner*—Amy He
(74) *Attorney, Agent, or Firm*—Banner & Witcoff, Ltd.

(57) ABSTRACT

A circuit tester in the form of a pliers includes first and second jaws with first and second probes respectively for engaging a wire to confirm circuit continuity and polarity. The probes are electrically connected in series with a bipolar or two color, light emitting diode and one of the probes may be pivoted out of the series circuit.

9 Claims, 3 Drawing Sheets

OTHER PUBLICATIONS

Invention Disclosure Agreement dated Aug. 21, 1990 by Ellis O. Sievers for a tool for auto testing lights.

Invention Disclosure Agreement dated Oct. 23, 1990 by Wilf Thomas for a 12V circuit tester.

Invention Disclosure Agreement, No. 95-852 dated Dec. 14, 1995 by Ben H. Steele for an electric circuit testing package.

Invention Disclosure Agreement, No. 01-311 dated Sep. 6, 2001 by Real Leduc for a test light tool.

Invention Disclosure Agreement dated Oct. 19, 1992 by Sebastian Osorio for a continuity test lamp and pliers.

Invention Disclosure Agreement dated Sep. 6, 1989 by Lee E. Cantero for a 12 volt light tester.

Invention Disclosure Agreement dated Sep. 6, 1988 by John R. Davis for an auto 12 volt test light.

Invention Disclosure Agreement, No. 00-451 dated Oct. 28, 2000 by Shawn Diamond for a tool for testing electrical current in wires on automobiles.

Invention Disclosure Agreement, No. 97-429 dated Aug. 8, 1997 by Alan Drewes for a tool for D.C. current testing.

Invention Disclosure Agreement dated Mar. 10, 1980 by Donald Gysben for a tool for piercing insulated wire.

Invention Disclosure Agreement, No. 97-282 dated May 15, 1997 by David Grimm for a tool for checking wiring for current.

Invention Disclosure Agreement, No. 97-096 dated Feb. 18, 1997 by Nick J. Verburg for a tool for a test light.

Invention Disclosure Agreement, No. 97-443 dated Jul. 31, 1997 by Aravi Partouche for a tool for polarity testing of automotive wires.

Invention Disclosure Agreement, No. 96-156 dated Mar. 5, 1996 by Paul T. Arndt for a tool for testing wires.

Invention Disclosure Agreement dated Oct. 4, 1972 by Joe Casillas for a tool to test a wire for current.

* cited by examiner

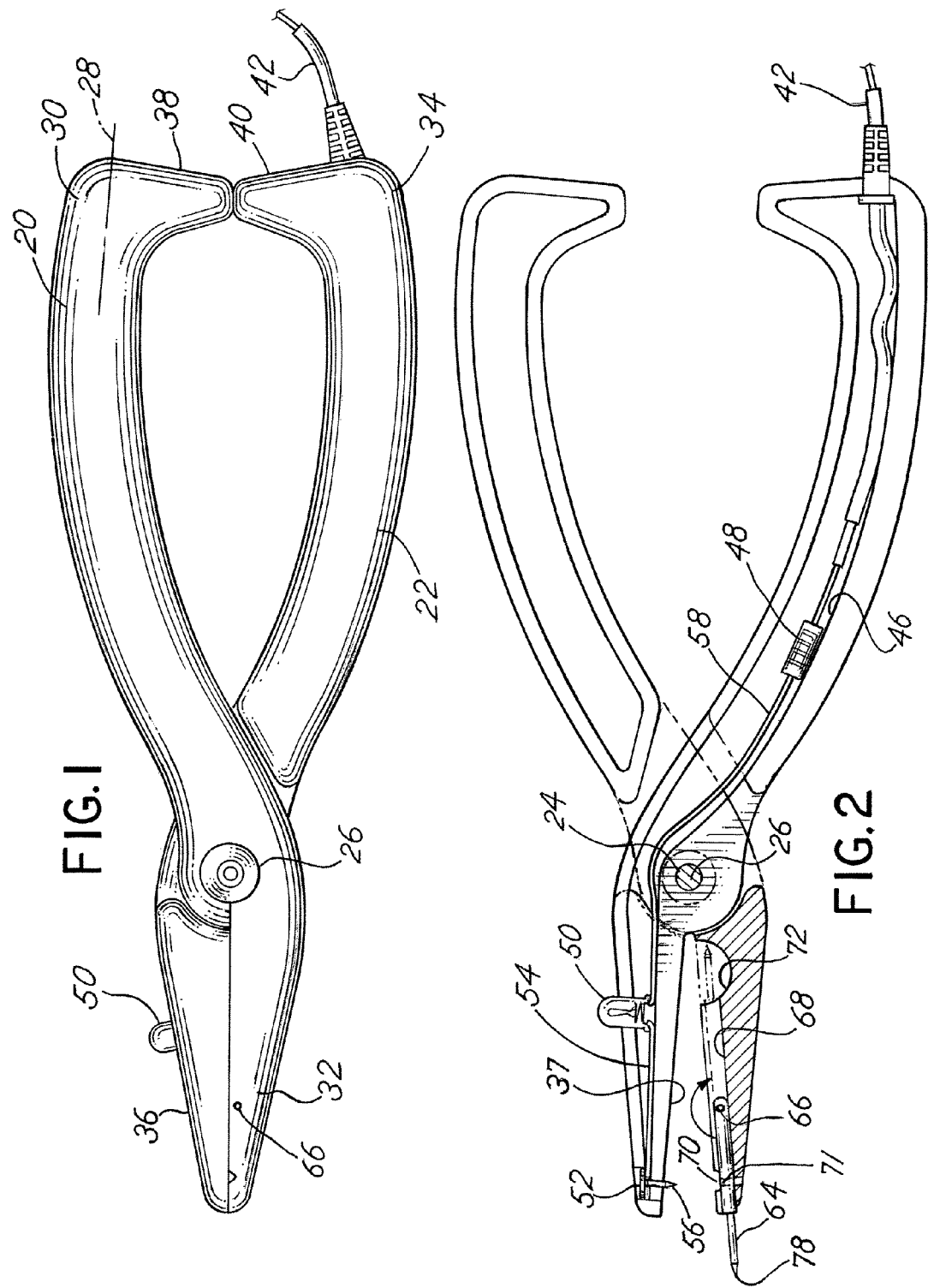

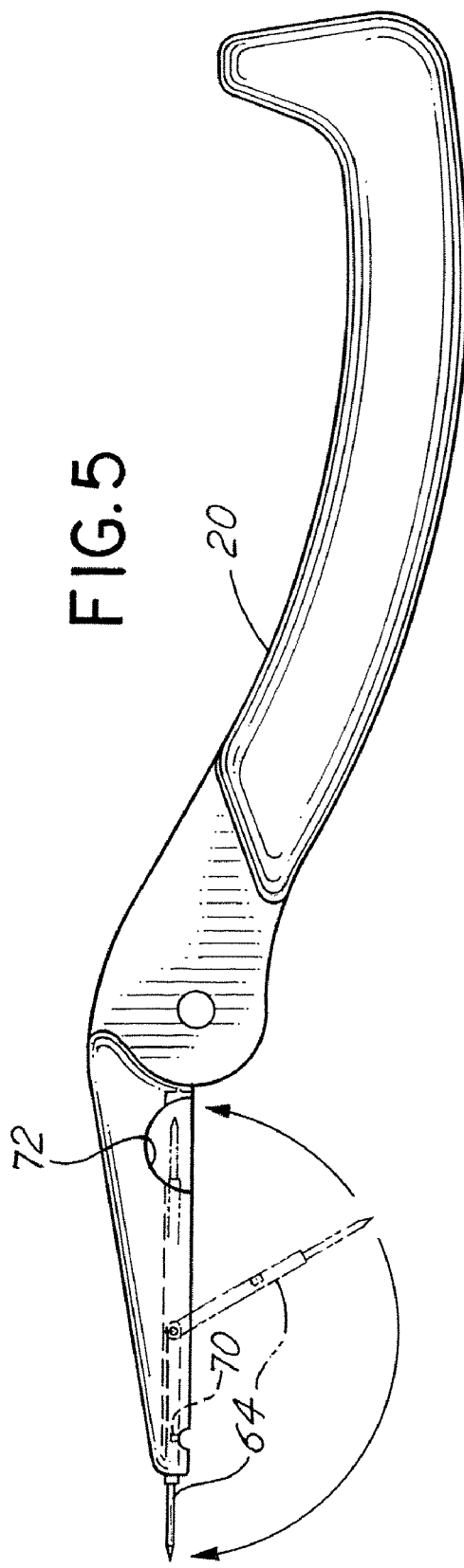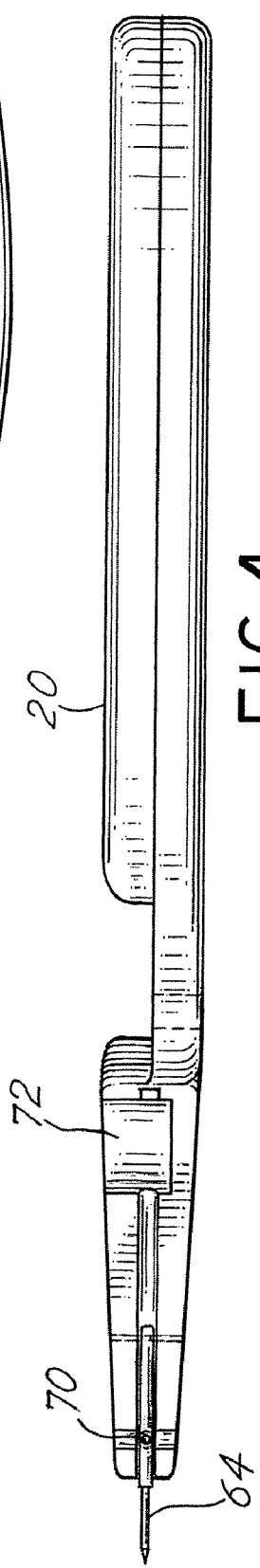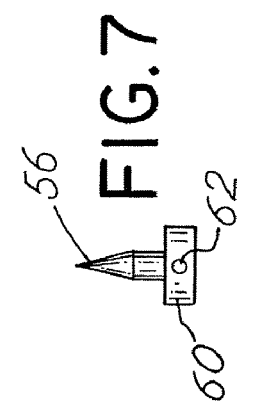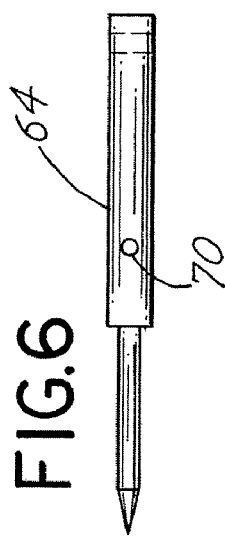

CIRCUIT TESTER DEVICE

BACKGROUND OF THE INVENTION

In a principal aspect the present invention relates to a circuit tester in the form of a pliers type device which includes a bipolar light emitting diode in combination with conductive probes incorporated in the jaws of the pliers.

In the automotive repair industry, it is often important to test the continuity of electric circuits. Numerous devices have been proposed to effect such continuity testing. By way of example, U.S. Pat. No. 6,552,522 B1 entitled Wire Cutter Tool with Integral Insulating Piercing Circuit Tester issued Apr. 22, 2003 depicts a typical pliers type circuit tester. A lead wire is connected through a pliers handle to a conductive probe. The conductive probe is designed to pierce the insulation of a wire and an electric light or other sensor in the circuit between the probe and ground or an electrical power source indicates the continuity of the circuit.

While such a construction is, in general, a beneficial tool for the investigation of circuit continuity, there has remained the need for an improved circuit tester.

SUMMARY OF THE INVENTION

Briefly, the present invention comprises a pliers type circuit tester which includes first and second handles connected by a pivot pin to enable pivoting about an axis transverse to the handles. A first lead wire, which may be connected to a power source or to ground, is directed through the hollow interior of one of the pliers handles which are made of insulating material. The first lead wire is connected to a bipolar light emitting diode mounted on the handle. A second lead wire connects from the light emitting diode and extends through the hollow jaw of the tool handle where it connects to a conductive probe that is designed to pierce a wire positioned in a slot of the opposite jaw of the pliers type tool. The diode senses the polarity of a circuit being tested and thus provides a visual indication, by virtue of the color emitted by the diode, of the polarity sensed.

A second conductive probe is housed in a slot in the second jaw and pivots between a position extending longitudinally from the second jaw to a position within a longitudinal slot in the second jaw. When the second probe is extended longitudinally, the first probe may engage the second probe when the jaws are closed to provide for electrical continuity through both of the probes. However, when the second probe is pivoted out of position into the jaw storage slot, the first probe may engage and pierce the insulation of a wire located in a slot of the second jaw. Thus, the tool includes a first probe associated with a first jaw and a second probe associated with a second jaw wherein the second probe is pivotal into and out of an engaging position with the first probe depending upon the pivot position of the second probe. The tool also includes stops to limit closure of the handles.

Thus, it is an object of the invention to provide an improved pliers type circuit tester.

A further object of the invention is to provide a pliers type circuit tester with means to limit closure of the handles comprising the tool.

Another object of the invention is to provide a rugged, yet highly useful circuit tester device which senses the polarity of a circuit.

A further object of the invention is to provide a pliers type circuit tester having a pair of probes which are each designed to engage with a wire or wire connection associated with a circuit depending upon the accessibility of the wire and wherein electrical continuity can be established through one of the probes or through both of the probes in series. That is, the probes of the invention may pierce the insulation on a wire to determine circuit continuity or may touch a wiring connector such as a contact or fuse to check continuity.

Another object of the invention is to provide a pliers type circuit tester which is economical, easy to manipulate and highly reliable.

These and other objects, advantages and features of the invention will be set forth in the detailed description which follows.

BRIEF DESCRIPTION OF THE DRAWING

In the detailed description which follows, reference will be made to the drawing comprised of the following figures:

FIG. 1 is a plan view of an embodiment of the invention;

FIG. 2 is a cut away cross sectional view of the embodiment of FIG. 1;

FIG. 4 is a plan view of a first handle member of the embodiment of the invention;

FIG. 5 is a side elevation of the component handle of FIG. 4;

FIG. 6 is a plan view of a pivotal probe utilized in the embodiment of the invention; and FIG. 7 is a plan view of a fixed probe utilized in the embodiment of the invention.

DESCRIPTION OF AN EMBODIMENT OF THE INVENTION

Figure 3:
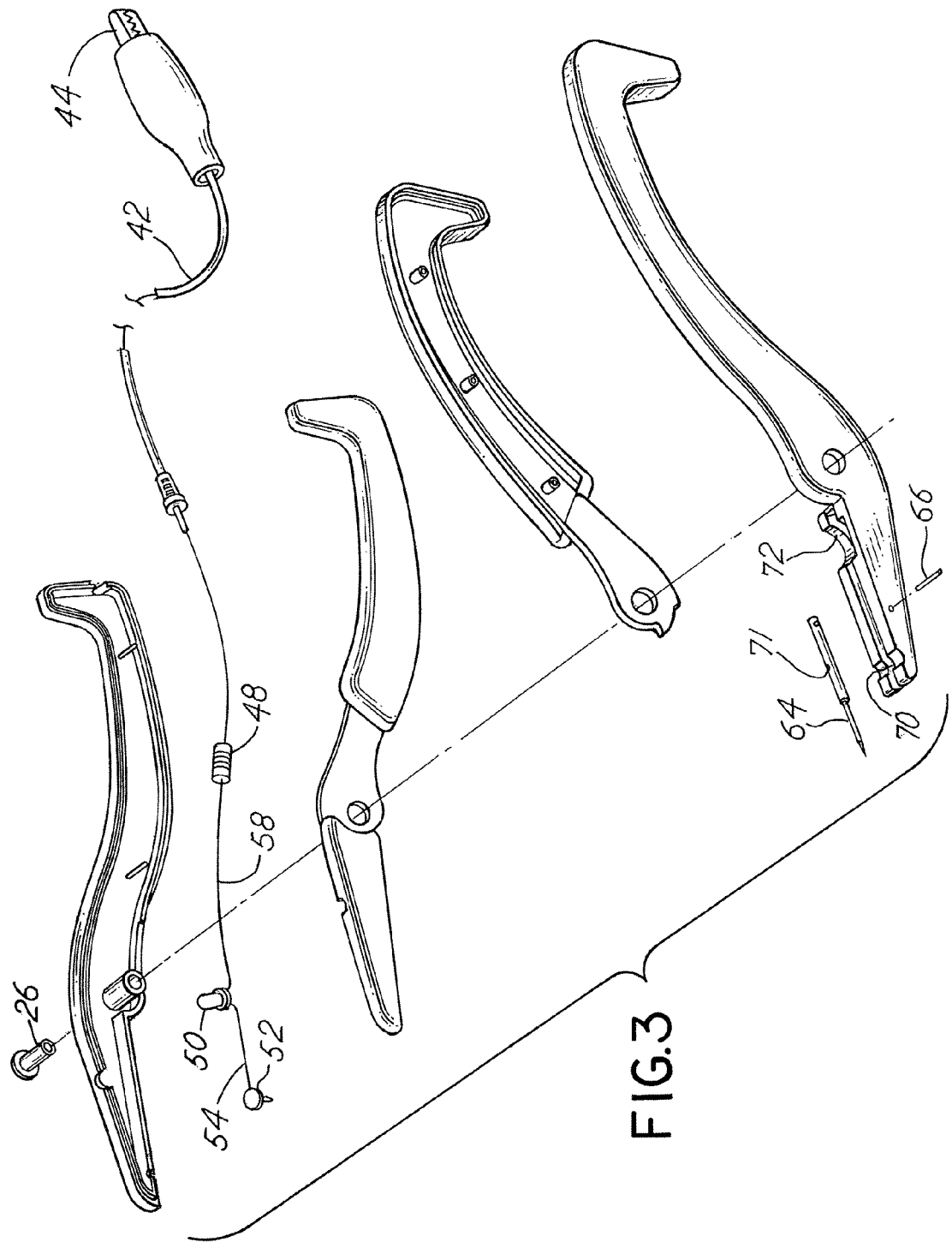
FIG. 3 is an exploded isometric view of the embodiment of FIG. 1.

Referring to the figures, the pliers type circuit tester embodiment includes a first handle 20 and a second handle 22 pivotally connected at a pivot connection 24 by a pin or rivet 26. The handles 20, 22 are hollow and molded from a polymeric material such as polycarbonate. The first handle 20 is elongate and defines a generally longitudinal axis 28 with a handle end 30 and a probe or jaw end 32. The second handle 22 also includes a handle end 34 and a jaw or probe or jaw end 36. The handle end 30 of the first handle 20 includes an inwardly extending stop 38 cooperative with an inwardly extending stop 40 molded in the second handle 22. The stops 40 and 38 are effective to limit the closure of the jaws 32 and 36.

An insulated lead wire 42 includes an end clamp 44, such as an alligator clamp, which enables the wire 42 to be connected to a power source or ground. The lead wire 42 fits through a longitudinal channel 46 in the second handle 22. In the embodiment depicted, the lead wire 42 provides a circuit through a resistor 48 within the hollow handle 22 which is connected in series via a wire 54 to a bipolar or two color, light emitting diode 50 mounted in the jaw 36 and projecting above the outer face of the jaw 36 so as to be visual. The wire 54 thus extends from the resistor 48 and through the second jaw 36 where it is connected with the light emitting diode 50. A wire 58 is part of a series circuit extending to the end of the jaw 36 where it connects to a first probe 52. The first probe 52 is illustrated in greater detail in FIG. 7 and includes a probe point 56 and a body section 60 which includes an opening 62 to receive the wire 58. The probe point 56 extends transversely from the inner face 37 of second jaw 36 toward the first jaw 32.

A second elongate probe 64 is pivotally mounted so that it may pivot about a transverse pivot pin 66 in a longitudinal slot 68 in the first jaw 32. The pivotal second probe 64 includes a probe point 78 and a recess detent or opening 71 for electrical connection with the point 56 of the first probe 52. Thus, the first pointed probe 52 may engage the second pointed probe 64 when the first and second jaws 32 and 36 are moved to the closed position to provide for a continuous series circuit through the two probes 32, 64, the wire 42, the wire 58, the wire 54, as well as the light emitting diode 50, resistor 48 and the connector clamp 44.

The second probe 64 may be pivoted out of a position of engagement with the first probe 52 by pivoting into a slot 68 about an axial mounting pin 66. Pin 66 is thus closer to pin 26 than the first probe 52 is. When probe 64 is pivoted to a position precluding engagement with first probe 52, a transverse slot 70 in the jaw 32 is exposed. Thus, a wire fitted in the transverse slot 70 may be engaged by the point 56 of the first probe 52.

A lateral recess finger opening 72 is defined in the second jaw 32 so that when the second probe 64 is pivoted into the longitudinal slot 68 it can be accessed manually through the passage or opening 72 and manipulated or pivoted.

In operation, when the jaws 32 and 36 are closed and second probe 64 is pivoted about pin 66 as shown in phantom in FIG. 2, the first probe 52 may be engaged with a wire in transverse slot 70 to check circuit continuity. Alternatively, the second probe 64 may be pivoted about the pin 66 in the slot 68 as shown in solid lines in FIG. 2 and continuity will then be effected by engagement of the point 56 of the first probe 52 with recess opening 71.

The benefits associated with the dual probe construction include a safety feature as a result being able to pivot the second probe 64 into the slot 68 in jaw 32 so that probe point 78 will not create a potential hazard to someone who is storing the tool in a tool cabinet or pouch so that when they reach for the tool they will not be accidentally stuck by the probe 64. Additionally, the design enables replacement of the second probe 64 in the event it breaks. Further, the second probe 64 may be manufactured from different materials and have various lengths as may the first probe 52.

While there has been set forth a preferred embodiment of the invention, it is to be understood that the invention is to be limited only by the following claims and equivalents thereof. That is, the shape and configuration of the pliers handles 20 and 22, the jaws 32 and 36 and the probes 52, 64 may be varied without departing from the spirit and scope of the invention. The inclusion of the stops 38 and 40 may be omitted or retained by way of further example.

What is claimed is:

1. A circuit tester comprising:
    a first pliers handle having a handle end and a probe end;
    a second pliers handle having a handle end and a probe end;
    each said handle formed from a molded, insulating material;
    a pivot connection of said handles intermediate the respective ends thereof;
    said second handle including an internal lead wire from the handle end to the probe end electrically connected in series to a bipolar light emitting diode in series, said light emitting diode connected in series to a first conductive probe extending generally transversely from the probe end of the second handle;
    said first handle including a second conductive probe pivotally mounted to extend longitudinally from the probe end of the first handle and positioned for electrical series contact by the first conductive probe upon closure of the probe ends of the first and second handles, said second probe pivotal to a second position out of electrical series contact with said first conductive probe upon closure of the probe ends of the first and second handles;
    said tester further including a slot in the probe end of the first handle extending longitudinally, said second conductive probe pivotally nested in said slot, said second conductive probe in the form of a pointed rod having a probe point extendable longitudinally from the probe end of the first handle.

2. The tester of claim 1 wherein the first conductive probe comprises a contact having a probe point extending therefrom and said probe end of the first handle includes a transverse slot for holding a wire in alignment with said first conductive probe point upon closure of the respective probe ends.

3. The tester of claim 2 wherein said rod includes a detent opening for electrical contact with said probe point of said first conductive probe.

4. The tester of claim 1 wherein said longitudinal slot extends in opposite directions from a pivot connection of said second conductive probe to said probe end of said second handle and wherein said first handle includes a lateral access passage to said slot.

5. The tester of claim 1 further including an electrical clamp and lead wire connected to the lead wire in the second handle.

6. The tester of claim 1 wherein each said handle end includes a transversely extending stop extension, said extension engageable to limit the pivotal movement of said handle ends together.

7. A circuit tester comprising:
    a first pliers handle having a handle end and a probe end;
    a second pliers handle having a handle end and a probe end;
    each said handle formed from a molded, insulating material;
    a pivot connection of said handles intermediate the respective ends thereof;
    said second handle including an internal lead wire from the handle end to the probe end electrically connected in series to a bipolar light emitting diode in series, said light emitting diode connected in series to a first conductive probe extending generally transversely from the probe end of the second handle;
    said first handle including a second conductive probe pivotally mounted to extend longitudinally from the probe end of the first handle and positioned for electrical series contact by the first conductive probe upon closure of the probe ends of the first and second handles, said second probe pivotal to a second position out of electrical series contact with said first conductive probe upon closure of the probe ends of the first and second handles,
    said tester further including a slot in the probe end of the first handle extending longitudinally, said second conductive probe pivotally nested in said slot, said second conductive probe in the form of a pointed rod having a probe point extendable longitudinally from the probe end of the first handle; and
    wherein the first conductive probe comprises a contact having a probe point extending therefrom and said probe end of the first handle includes a transverse slot for holding a wire in alignment with said first conductive probe point upon closure of the respective probe ends, and
    wherein said longitudinal slot extends in opposite directions from a pivot connection of said second conductive probe to said probe end of said second handle and wherein said first handle includes a lateral access passage to said slot.

8. A circuit tester comprising:
a first pliers handle having a handle end and a probe end;
a second pliers handle having a handle end and a probe end;
each said handle formed from a molded, insulating material;
a pivot connection of said handles intermediate the respective ends thereof;
said second handle including an internal lead wire from the handle end to the probe end electrically connected in series to a bipolar light emitting diode in series, said light emitting diode connected in series to a first conductive probe extending generally transversely from the probe end of the second handle;
said first handle including a second conductive probe pivotally mounted to extend longitudinally from the probe end of the first handle and positioned for electrical series contact by the first conductive probe upon closure of the probe ends of the first and second handles, said second probe pivotal to a second position out of electrical series contact with said first conductive probe upon closure of the probe ends of the first and second handles; and
said tester further including a slot in the probe end of the first handle extending longitudinally, said second conductive probe pivotally nested in said slot, said second conductive probe in the form of a pointed rod having a probe point extendable longitudinally from the probe end of the first handle; and
wherein the first conductive probe comprises a contact having a probe point extending therefrom and said probe end of the first handle includes a transverse slot for holding a wire in alignment with said first conductive probe point upon closure of the respective probe ends; and
wherein said longitudinal slot extends in opposite directions from a pivot connection of said second conductive probe to said probe end of said second handle and wherein said first handle includes a lateral access passage to said slot, and
further including an electrical clamp and lead wire connected to the lead wire in the second handle.

9. A circuit tester comprising:
a first pliers handle having a handle end and a probe end;
a second pliers handle having a handle end and a probe end;
each said handle formed from a molded, insulating material;
a pivot connection of said handles intermediate the respective ends thereof;
said second handle including an internal lead wire from the handle end to the probe end electrically connected in series to a bipolar light emitting diode in series, said light emitting diode connected in series to a first conductive probe extending generally transversely from the probe end of the second handle;
said first handle including a second conductive probe pivotally mounted to extend longitudinally from the probe end of the first handle and positioned for electrical series contact by the first conductive probe upon closure of the probe ends of the first and second handles, said second probe pivotal to a second position out of electrical series contact with said first conductive probe upon closure of the probe ends of the first and second handles; and
said tester further including a slot in the probe end of the first handle extending longitudinally, said second conductive probe pivotally nested in said slot, said second conductive probe in the form of a pointed rod having a probe point extendable longitudinally from the probe end of the first handle; and
wherein the first conductive probe comprises a contact having a probe point extending therefrom and said probe end of the first handle includes a transverse slot for holding a wire in alignment with said first conductive probe point upon closure of the respective probe ends; and
wherein said longitudinal slot extends in opposite directions from a pivot connection of said second conductive probe to said probe end of said second handle and wherein said first handle includes a lateral access passage to said slot; and
further including an electrical clamp and lead wire connected to the lead wire in the second handle, and
wherein each said handle end includes a transversely extending stop extension, said extension engageable to limit the pivotal movement of said handle ends together.

* * * * *